United States Patent [19]

Murayama

[11] Patent Number: 5,719,512
[45] Date of Patent: Feb. 17, 1998

[54] DIGITAL OSCILLATING CIRCUIT FOR MULTIPLE SYSTEMS-READY TELEVISION RECEIVERS

[75] Inventor: Akihiro Murayama, Kanagawa-ken, Japan

[73] Assignee: Kabushiki Kaisha Toshiba, Kanagawa-ken, Japan

[21] Appl. No.: 577,099

[22] Filed: Dec. 22, 1995

[30] Foreign Application Priority Data

Dec. 22, 1994 [JP] Japan .................. 6-320369

[51] Int. Cl.$^6$ .................................. H03L 7/06
[52] U.S. Cl. ............... 327/159; 327/107; 327/160; 327/291; 331/17; 331/25; 348/505; 348/508
[58] Field of Search .................. 327/105–107, 327/141, 144–151, 155–160, 162, 163, 291, 293, 294; 331/1 A, 2, 8, 18, 20, 25, DIG. 2; 375/362, 373, 376; 348/505–509

[56] References Cited

U.S. PATENT DOCUMENTS

| | | | |
|---|---|---|---|
| 4,145,667 | 3/1979 | Messerschmitt | 331/16 |
| 4,625,232 | 11/1986 | Nillesen | 348/639 |
| 4,686,560 | 8/1987 | Balaban et al. | 348/508 |
| 4,689,664 | 8/1987 | Moring et al. | 348/639 |
| 4,694,327 | 9/1987 | Demmer et al. | 348/508 |
| 4,802,009 | 1/1989 | Hartmeier | 348/537 |
| 4,965,533 | 10/1990 | Gilmore | 331/18 |
| 5,010,506 | 4/1991 | Hrncirik | 364/721 |
| 5,329,253 | 7/1994 | Ichihara | 331/17 |
| 5,355,171 | 10/1994 | Miyazaki et al. | 348/505 |

FOREIGN PATENT DOCUMENTS

| | | |
|---|---|---|
| 0 492 588 | 7/1992 | European Pat. Off. . |
| 5-91522 | 4/1993 | Japan . |

Primary Examiner—Timothy P. Callahan
Assistant Examiner—Kenneth B. Wells
Attorney, Agent, or Firm—Cushman Darby & Cushman IP Group of Pillsbury Madison & Sutro LLP

[57] ABSTRACT

An oscillator includes a frequency-controllable clock generator, and a digital oscillator responsive to a clock generated by the clock generator for oscillating a data sequence at a period in proportion to the clock and also discretely controllable in accordance with a frequency switching signal.

19 Claims, 9 Drawing Sheets

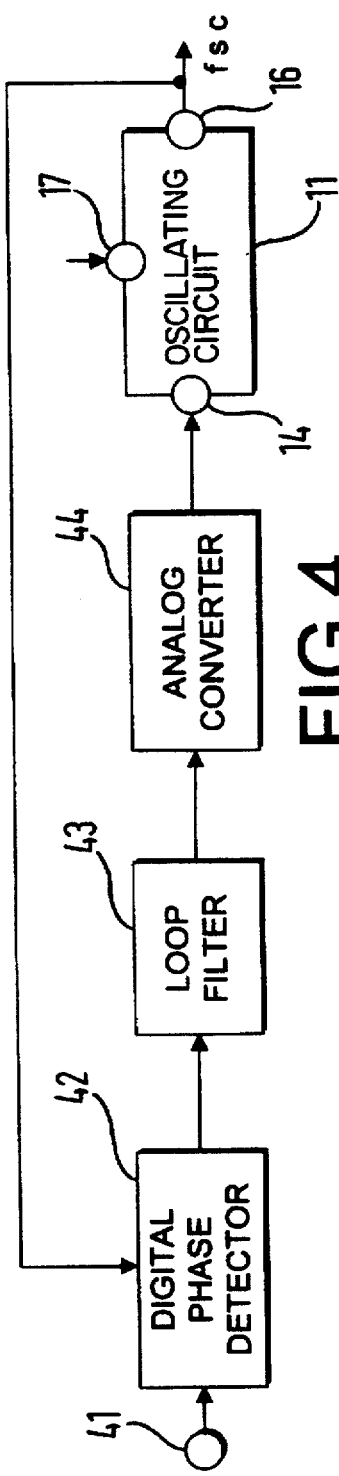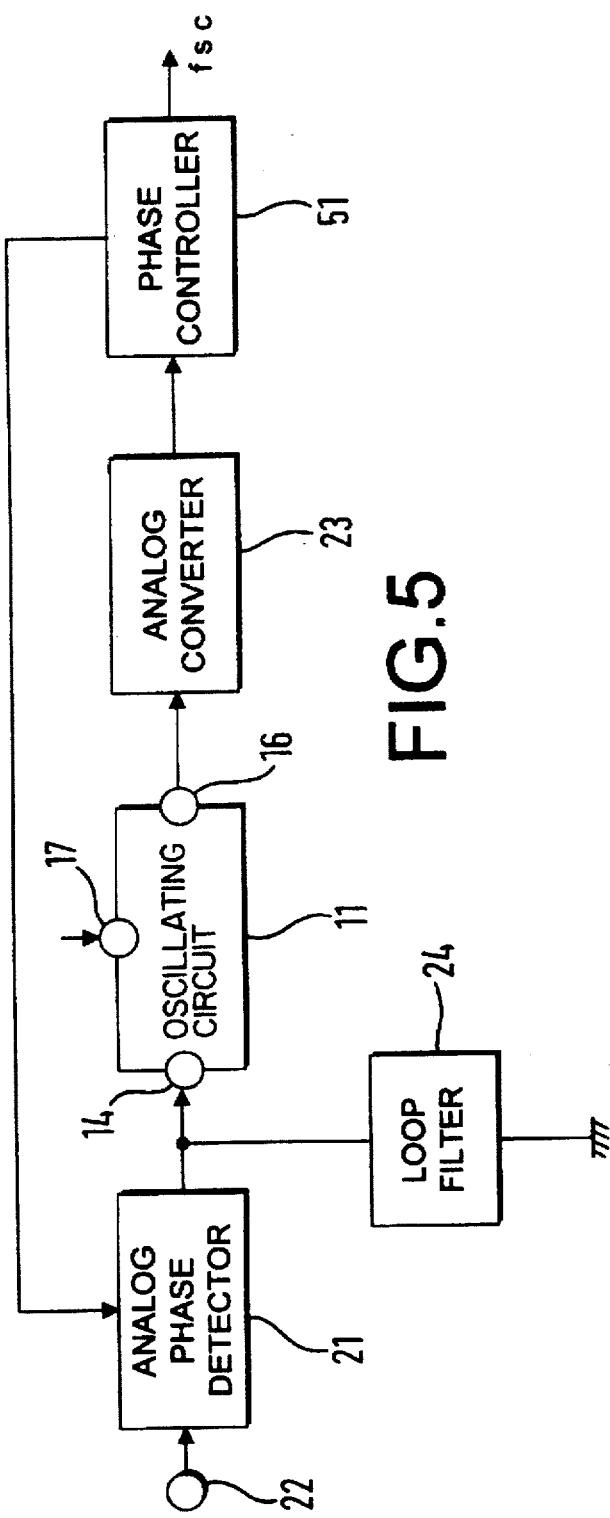

5,719,512

DIGITAL OSCILLATING CIRCUIT FOR MULTIPLE SYSTEMS-READY TELEVISION RECEIVERS

FIELD OF THE INVENTION

The present invention relates to an oscillator which is suitable for multiple systems-ready color television receivers.

BACKGROUND OF THE INVENTION

There are three standard modulation systems, i.e., the NTSC, the PAL and the SECAM used for modulating a television signal. In some areas where a plurality of systems can be received, multiple systems-ready color television receivers can be utilized. Among the three systems mentioned above, the PAL system uses different color subcarrier frequencies (fsc) in accordance with the requirements in different geographic areas. For example, in South America the NTSC system, the M-PAL and the N-PAL systems are mixed. To receive a croma signal by such TV receivers, it is necessary to reproduce the color subcarrier from a transmitted burst signal. Usually, a chrominance signal processing circuit in the analog system receiver contains a plurality of quartz oscillators (X'tals), each oscillator associated with a prescribed chrominance signal frequency. The processing circuit selectively uses the quartz oscillator to generate a desired color subcarrier. The system will be described in reference to FIG. 10.

In FIG. 10, a burst signal input to an input terminal 101 is supplied to one input terminal of a phase detector 102. An output of the phase detector 102 is applied to a frequency control terminal 103a of a quartz oscillator circuit 103 and to a loop filter 104. Quartz oscillators 106a to 106c are connected to an oscillator 105 which varies the oscillation frequency using the control signal supplied to the frequency control terminal 103a. A control terminal 103b in the quartz oscillator circuit 103 connects a selected quartz oscillator from the quartz oscillators 106a to 106c to the oscillator 105 by a control signal from outside. An output of the oscillator 105 is supplied to an output terminal 103c as an output of the quartz oscillator circuit 103. From here, the output of the quartz oscillator circuit 103 is supplied to the other input of the phase detector 102.

The conventional apparatus locks the phases of the input burst signal and the output of the quartz oscillator circuit 103 together. When these phases are matched with each other, the chrominance demodulating circuit of the system modulates a color difference signal. The PLL loop, which is necessary for reproducing of the color subcarrier, is referred to as an APC loop or an APC circuit.

When the system as described above is individually constructed for different geographic areas, there will be many types of chassis for the TV receivers, making the manufacturing process at the producer side complicated. As a result, there has been a trend to standardize the chassis the worldwide. However, the chassis used in South-America is expensive to manufacture since it needed three expensive quartz oscillators, as shown in FIG. 10, making standardization a high-priced proposition.

Generally, a multi-color systems-ready TV has a system which can receive both PAL/NTSC systems. This type of TV still needs two quartz oscillators. By comparison, the SECAM system adapts a FM modulation system different from other systems, so that it takes different chrominance demodulation processing. Thus, the SECAM system has a processing circuit in addition to the circuit for the PAL and NTSC systems, and it does not need an oscillation circuit. Accordingly, the oscillation circuit needs to accommodate four frequencies: frequencies associated with a BG-PAL system (4.43 MHz), an M-PAL system (3.575 MHz), an N-PAL system (3.582 Mhz) and the NTSC system (3.579 Mhz).

Recently, systems tended not to accommodate an analog technique as shown in FIG. 10, but instead used a digital technique as shown in FIG. 11. The digital system is mentioned in the context of a "direct processing digital synthesizer" in "Design and Application of Oscillators", pp. 305–329 issued by CQ Publishing Co. Ltd. Here, the digital system will be called a "digital oscillator circuit" and used in place of the quartz oscillator circuit 103 in the analog TV receiver, as shown in FIG. 10.

In FIG. 11, a clock signal fCLK generated in a clock generator 112 is supplied to a digital oscillator 111 as a master clock. The oscillation frequency is varied by data supplied from a frequency control data input terminal 113 of the digital oscillator 111. Since a digital oscillator 114, which will be described in detail later, can accurately change its oscillation frequency to any given value by changing the input data, it can easily generate all of the four color subcarrier frequencies fsc. The system, as shown in FIG. 11, needs only one quartz oscillator 115 for the master oscillation, so that it can achieve standardization and cost reduction at the same time.

Peripheral parts of the APC in the chrominance signal processing part will be explained in reference to FIG. 12. In FIG. 12, a digital oscillator system is constructed on a chassis accommodating a digital circuit. The same elements as those shown in FIG. 11 are assigned with the same reference numerals.

Only the burst signal is extracted from the analog composite video signals and carried out in an A/D conversion by an A/D converter (not shown). A digital phase detector 121 compares the phases of the digitized burst signal supplied to an input terminal 122 with the output of the digital oscillator 111 from an output terminal 123. The comparison result data ΔSA is supplied to a frequency control terminal 113 of the digital oscillator 111 through a loop filter 124. Besides the comparison result data ΔSA, a control signal for changing color subcarrier frequencies fsc suitable for the prescribed system is supplied to an initial data generator 126 from a control terminal 125. The initial data generator 126 generates initial data ΔSO for obtaining each oscillation frequency fsc and applies each color subcarrier frequency fsc to an adder 127. The initial data ΔSO and the comparison result data ΔSA are added in the adder 127 and then the resultant sum data ΔS from the adder 127 is input to an accumulated data generator 128. The accumulated data generator 128 outputs oscillation data under the control of the master clock fCLK from the clock generator 115.

Before explaining the APC operation, the operation of the accumulated data generator 128 will be explained with reference to FIGS. 13 and 14. The accumulated data generator 128 comprises an accumulator 131 and a waveform converter 132, as mentioned in the above-referenced document. The accumulator 131, which comprises a full adder 131a and a latch 131b, adds the recent output sum data and the sum data ΔS at every single clock of the master clock fCLK. In such a construction as described above, the output of the accumulator 131 will be increased by the amount of the sum data ΔS at every clock of master clock fCLK, causing an overflow of data in the end. Then, the data drops toward 0, creating a sawtooth waveform. Accordingly, if the master clock fCLK is constant and once the bit length of the adder has been fixed, the interval causing the overflow varies by changing the sum data ΔS. By regarding the interval as an oscillation frequency, the oscillating frequency can be controlled by the sum data ΔS. Here, the output data of the accumulator 131 has a sawtooth waveform, though generally it is more desirable to provide a sinusoidal waveform signal to the APC circuit. This is because the sawtooth wave contains a large amount of noise, making the normal phase detecting operation of the APC difficult. So, the sawtooth waveform data sequence is replaced by the sinusoidal waveform signal in the waveform converter.

Many embodiments of the waveform converter used in this case are realized by sinusoidal waveform data-storing ROMs. In the sinusoidal waveform data-storing ROM, the sinusoidal waveform data is stored by associating addresses in advance. Then, the sinusoidal waveform data are read by assuming the sawtooth waveform data sequence as the addresses. According to the assumption, the sawtooth waveform data sequence is changed to a sinusoidal waveform data sequence so that it can output a signal suitable for the APC. Since the phase detector multiplies the burst signal and the oscillating signal generated in the digital generator, it has basically no problem when the phase of the oscillating signal is fixed. It is the most stable to get a 50% duty cycle signal. However, if only the basic operation is discussed, the waveform need not be changed into a sinusoidal waveform; it can be changed to a triangular wave or some other wave instead. Here, the waveform conversion is not limited to a sinusoidal waveform data-storing ROM to explain the device in the general sense.

The oscillation frequency control of the digital oscillator 114 is realized by changing the sum data ΔS. However, since the APC circuit influences the frequency received by it, the data for establishing the initial frequency and the data for changing the frequency are treated separately. The initial frequency, that is the free run frequency, is established by the initial data ΔSO, and the data for changing the frequency is established by the comparison result data ΔSA. The phase detector 121 is a phase comparator which multiplies the burst signal and the output signal of the data accumulator 128. Only low frequency data is extracted through a loop filter circuit 124 using the multiplied result. Since the extracted data varies a little, the oscillation frequency of the digital oscillator 114 is made equal to the burst frequency to finally synchronize with the burst frequency. Thus, a color subcarrier frequency fsc equal to the burst frequency is reproduced.

In the system using the digital oscillator 114 as described above, since the data frequency in the digital oscillator 114 is defined by the initial data ΔS, i.e., the digital data, the bit length needed in the data accumulator 128 for obtaining a required resolution becomes extremely large, requiring a large scale, high-cost circuit. Since the frequency is controlled by the digital data, the oscillation frequency takes on only a discrete value and it does not watch the input burst frequency accurately. Accordingly, the output data of the phase detector 121 causes a frequency jump corresponding to at least one bit of data and a change in the oscillation frequency of the digital oscillator 114 during each phase detection (one time each horizontal line) since the change in the oscillation frequency leads to the phase change in the color subcarrier signal fsc and the change in the demodulated color phase. To check the phase difference to the extent that it cannot be seen by human eyes, it is necessary to check the effect of the frequency jump corresponding to one bit of data for as small a unit as possible. It is assumed that 0.4 degrees is a detection limit for the end of one line video signal after the burst is detected. The detection limit is about 30 Hz in the frequency of the color subcarrier fsc.

This is the bit resolution of the digital oscillator 114. If the bit length has an N bit size, it is necessary to set the master clock $fCLK/2^N$ below 30 Hz. When the master clock fCLK is assumed to be 16 MHz, N will be 19. When a margin from a detection limit is considered, N will be around 22 to 24. Whether an accumulator 131 having so many bits can be added at once by the master clock fCLK will depend on the speed of the accumulator 131.

However, since it is difficult to process the addition all at once in the present device, the addition is usually performed by dividing the data into an upper bit part and a lower bit part so that the added data in the lower bit part is carried to the upper bit part by the next clock and then added. The added data in the lower bit part is delayed by the latch to align the timings of all bits for the adding output timing. The faster the clock becomes, the smaller the bit parts have to be defined. Further, the faster the clock becomes, the more the added output in the lower bit part is delayed by the latch and the number of stages of each latch will increase.

Further, if the phase detector 121 is configured by a digital circuit, since the operation is operated by a multiplication process, the output will be delayed by the step of the clock frequency. In addition, the APC information is supplied to the digital oscillator after being delayed for several clocks by the output delay in taking a timing of the comparison result data ΔSA and the initial data ΔSO in the adder 127, seriously affecting the APC pull-in time. In the case of the analog APC in FIG. 10, since the multiplication processing is performed in real time, it does not create a delay in the clock. In the cases of FIGS. 10 and 11, since the loop filter is located after the phase detector, only low frequency components of the APC pass through the filter. Here, the delay time occurs equally in both the analog system and the digital system, so this delay can be neglected. The delay of the signal over the phase detection in the digital oscillator, however, makes the APC pull-in time even longer in the digital system.

Empirically, in the analog APC system, the APC pull-in operation is completed within four fields. However, in the digital system in FIG. 12, the APC pull-in operation extends over about eight fields. When the color subcarrier signal fsc to be received is limited to only one, system like in receivers for Japan, the time difference between four fields and eight fields and the coloring time required at a channel changing operation is not a big problem. However, for a multi color systems-ready receiver, the time difference will be a big problem. That is, as shown in FIG. 10, when there is a difference between the frequency from the oscillator 105 and the burst frequency, the APC system repeats the change of the quartz oscillators such that it changes the quartz oscillators after a period of time and performs the APC detection again with another quartz oscillator. Since the quartz oscillators are not changed during the APC pull-in time, the time for changing the quartz oscillators will take a time equal to or longer than the quartz oscillator changing time.

For example, if the cycle equals eight fields, the changing operation of three quartz oscillators takes a maximum of 31 fields until the completion of the APC pull-in operation. This corresponds to 0.5 seconds, long enough to be noticed by viewers. In the case of the analog circuit, like the digital circuit, when the cycle equals four fields, the changing operation takes a maximum of 15 fields, corresponding to 0.25 seconds. The difference of 0.25 seconds has a large visual effect since the difference is detectable by a human; In other words, a human eye sharply responds to the time differences. Practically, since the quartz oscillator changing cycle takes longer than the frequency pull-in time, the absolute time will be expanded even more. In other words, the time delay will be noticeably increased.

As described above, a conventional oscillator using the full digital APC system configured by direct composition system digital synthesizers has drawbacks such as slow APC pull-in operation, low precision, large circuit scale (23 bits), and high cost even though it needs only one quartz oscillator in the multi-systems-ready television receiving system.

SUMMARY OF THE INVENTION

It is, therefore, an object of the present invention to provide an oscillator which can be used in an APC (PLL) circuit having a small circuit scale and a short APC pull-in time.

In order to achieve the above object, an oscillating circuit according to one aspect of the present invention includes a clock generator where the frequency changes in an analog operation by an impressed voltage or current of an analog circuit. The oscillating circuit controls the bit length of the accumulated data oscillator, takes an error of the initial oscillation frequency which is as large as possible within an acceptable range, and eliminates the adder for adding the comparison result data ΔSA and the initial data ΔSO. Further, the output of the phase detector is taken out by the analog system and output to the clock generator, so that the object as described above is achieved.

According to the arrangement as mentioned above, since the bit length in the accumulated data generator is shortened, the accumulator scale itself is reduced. Further, since the steps for dividing the additional bits are reduced, the delay of the added result caused by the latch is also reduced. Since it does not have the adder for adding the comparison result data ΔSA and the initial data ΔSO, the element reduction effect in the digital oscillator can be increased. Also, since the master clock fCLK is controlled from the phase detector using an analog operation, the oscillation frequency in the digital oscillator can be also be an analog operation, and the limitations in the frequency resolution caused by the digital oscillator can be removed.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 4 is a block diagram for explaining other applications of the present invention shown in FIG. 1;

FIG. 5 is a block diagram for explaining another different application of the present invention which adds the phase controller to the analog phase detector;

DESCRIPTION OF THE PREFERRED EMBODIMENTS

Embodiments of the present invention will be explained hereinafter in reference to the attached drawings, FIGS. 1–9.

Figure 1:
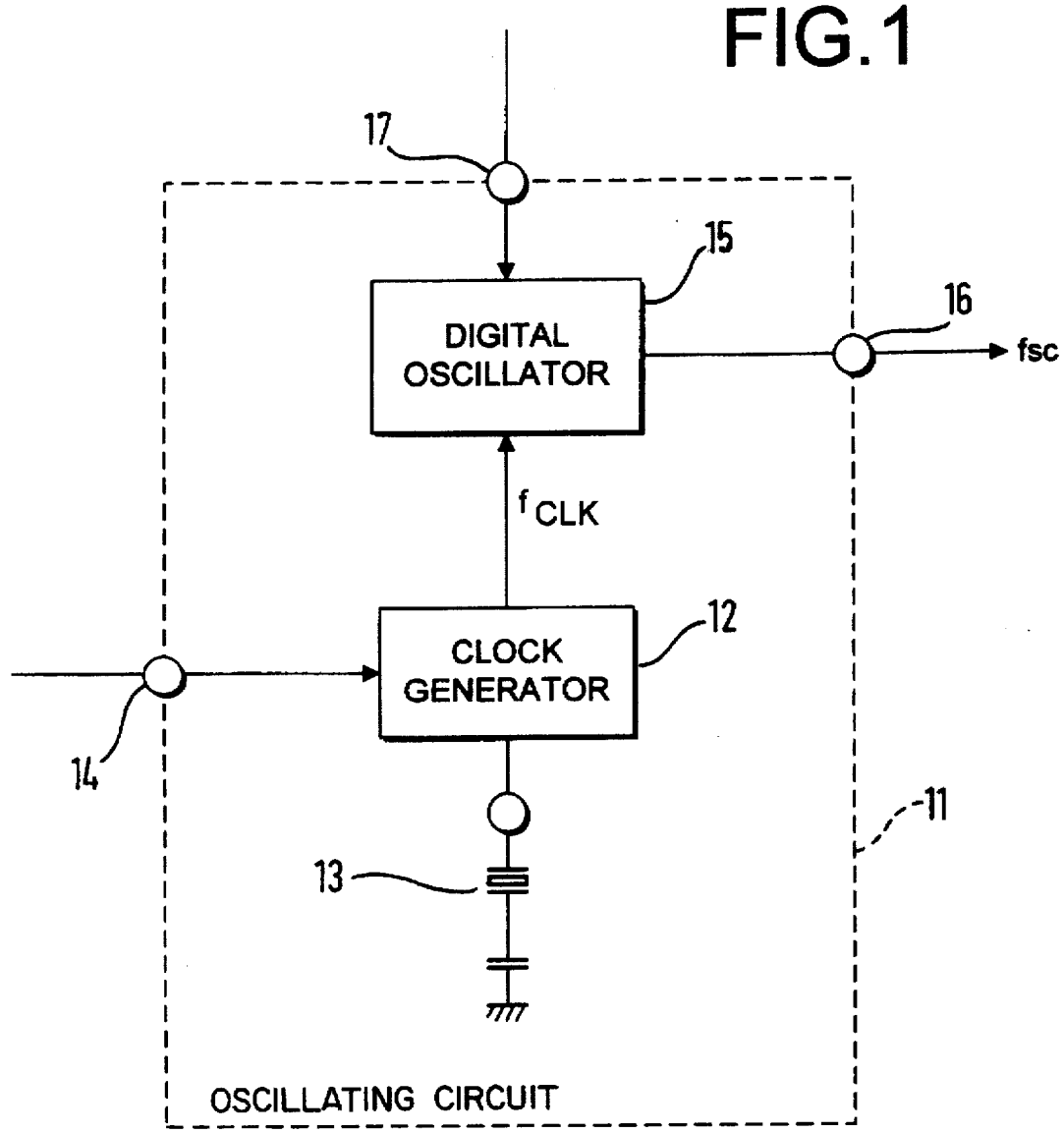
FIG. 1 is a block diagram for explaining one embodiment of the present invention.

FIG. 1 shows a system illustrating one embodiment of the present invention. In FIG. 1, the reference numeral 11 denotes a digital oscillating circuit. In the digital oscillating circuit 11, a master clock fCLK is generated by connecting one quartz oscillator 13 to an analog system clock generator 12. An analog control signal is input to the clock generator 12 through a frequency control terminal 14. The master clock fCLK is supplied to a digital oscillator 15, and a color subcarrier signal fsc is introduced from the digital oscillator 15 to an output terminal 16. A control signal for changing the oscillating color subcarrier signal fsc associated with a particular television system is input to the digital oscillator 15 through a control terminal 17.

A detailed explanation of the digital oscillating circuit 11 will be provided later. The digital oscillating circuit 11 does not have an input of comparison result data ΔSA shown in FIG. 12; thus, it also does not have an adder 127 like the one shown in FIG. 12. Since the master clock fCLK changes in analog operations to obtain a desirable frequency, it will be unnecessary to consider the bit resolution in the digital oscillating circuit 11. Besides, since the frequency jump corresponding to one bit of data does not occur by the complete phase synchronization, it is also unnecessary to discuss the color phase difference detection limit at the one line ending time.

Figure 2:
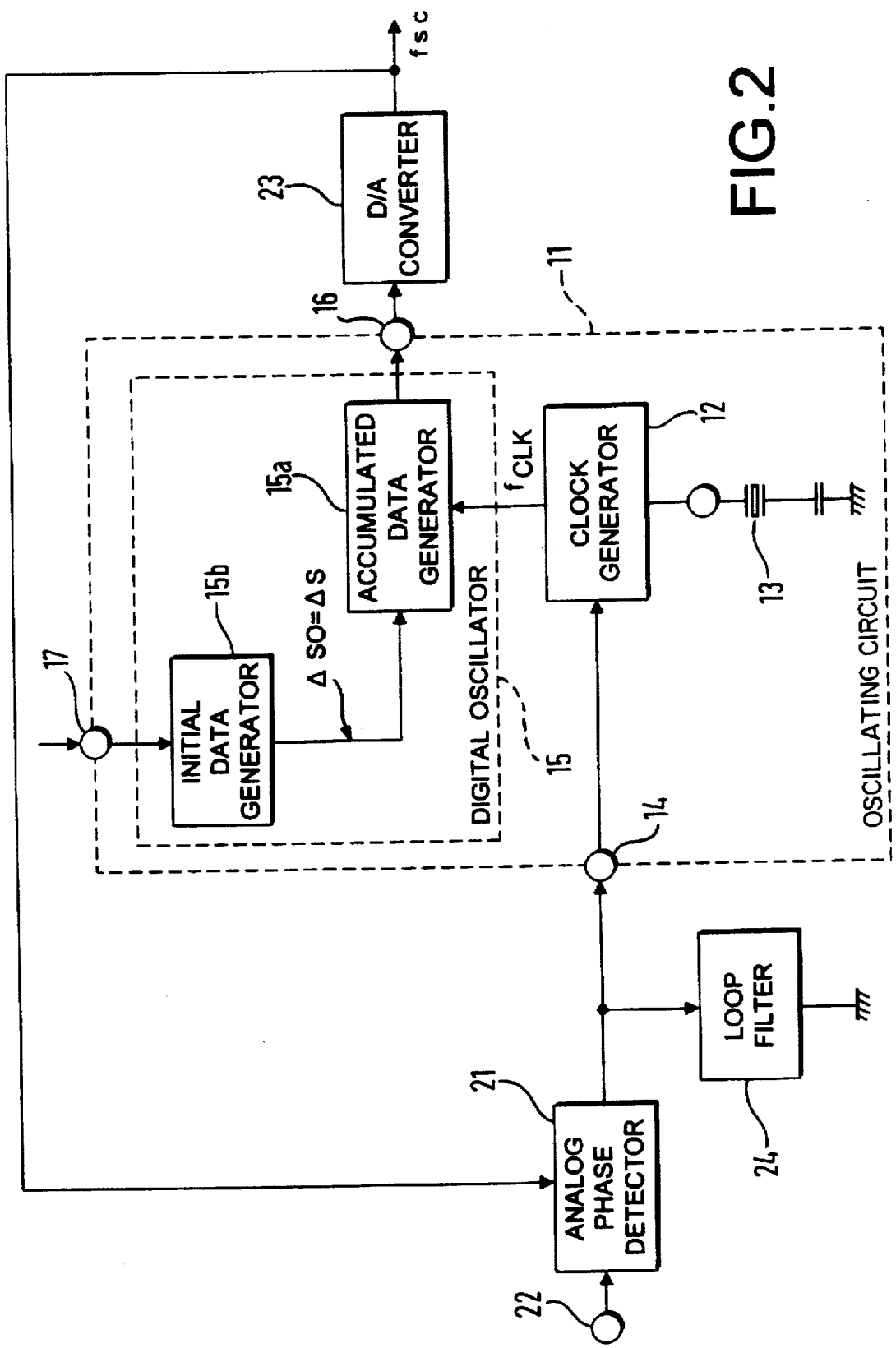
FIG. 2 is a block diagram for explaining an application of the present invention using FIG. 1.

FIG. 2 shows an example of when the system in FIG. 1 is used as an APC circuit of a TV receiver. The same components as those shown in FIG. 1 are assigned the same reference numerals.

A burst signal obtained from a composite video signal is applied to an input terminal 22 of an analog phase detector 21. Here, the output of the digital oscillating circuit 11 is phase-compared with the analog conversion signal via an analog converter 23. An output signal having its low frequency band extracted by a loop filter 24 is connected to a frequency control terminal 14 of a clock generator 12. The clock generator 12 changes the oscillation frequency using a frequency control signal. The oscillation signal obtained from the clock generator 12 is input to an accumulated data generator 15a in the digital oscillator 15 as a master clock fCLK. On the other hand, a signal for changing the frequency of the color subcarrier signal fsc is input to an initial data generator 15b in the digital oscillator 15 from a changing terminal 17. The initial data for defining the initial oscillation frequency of the color subcarrier signal fsc changes the initial data ASO, which is equal to a given sum data ΔS according to the changing signal. Since the comparison result data ΔSA is not in the accumulated data of the accumulated data generator 15a, the initial data ΔSO is equal to the given sum data ΔS. As explained in the conventional example, in the accumulated data generator 15a, the sum data ΔS is added at each master clock fCLK. Since the amount of data steadily rises toward overflow, a sawtooth waveform data sequence is obtained and a data sequence output having a least distortion is obtained by converting the sawtooth waveform data sequence into a sinusoidal waveform.

An analog output signal obtained from the burst signal and the output of the digital oscillator 15 via an analog converter 23 is phase-compared in a phase detector 21, and a comparison result is obtained by the analog converter 23. The signal is passed through the loop filter 24 to extract the low components and is supplied to the clock generator 12 as an analog signal. In the clock generator 12, the frequency changes very little due to the signal; as a result, it changes the output frequency of the digital oscillator 15 very little. At the end, the phase detector 21 drives the oscillation frequency of the digital oscillator 15 and phase-synchronizes the digital oscillator 15 with the burst signal completely. The sum data ΔS only controls the initial oscillation frequency. Since the controlling of phase detection is operated by the master clock fCLK, the controlling parameter is divided into two parts, making it unnecessary to add APC controlling information on the sum data ΔS. Generally speaking, the fsc changing terminal 17 is provided for coarse adjustment of the oscillation frequency of the digital oscillator 15, while the frequency control terminal 14 is operated for finer adjustment.

Figure 9:
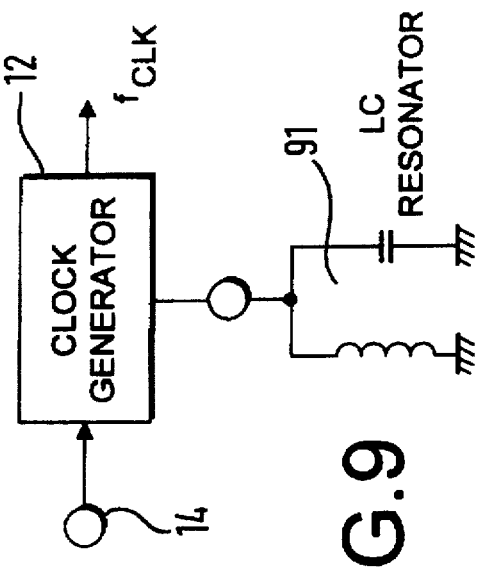
FIG. 9 is a block diagram for showing an external converting example of the clock generator of the present invention.
Figure 10:
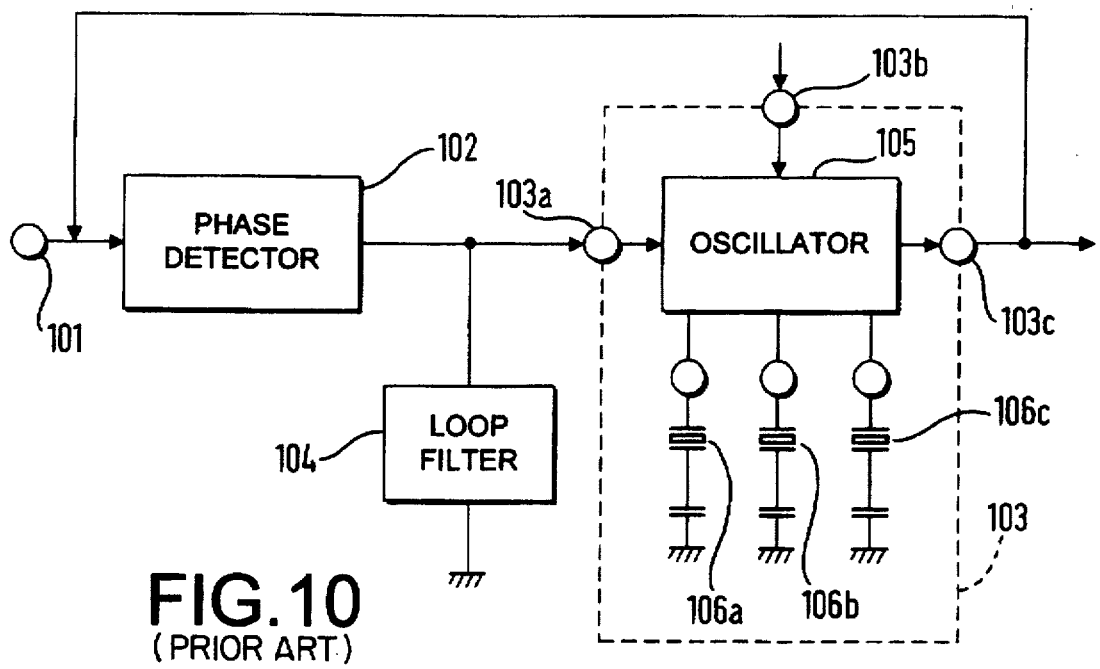
FIG. 10 is a block diagram showing a conventional APC circuit.

In the conventional system shown in FIG. 10, the frequency band of the quartz oscillator circuit 103 ranges from +500 to +700 Hz compared with that of the color subcarrier signal fsc. If the clock generator 12 in FIG. 2 has the same ratio, for instance, the master clock fCLK is 16 MHz, which is four times the frequency of the color subcarrier fsc, it can have a frequency band from about ±2 to ±3 KHz. The setup is enough to be corresponded by the analog circuit. Since the master clock is varied in the digital oscillator 15, the error from the frequency of the color subcarrier signal fsc of the initial oscillator caused by ΔS can be large. If anything, it may be an initial oscillation frequency error to the extent of the conventional oscillator in FIG. 9, ranging from 0 to 100 Hz, ±5 HZ. If the bit length of the accumulated data generator has an M bit size (M is an integer) for a certain master clock fCLK, the oscillation frequency fosc of the digital oscillator 15 can be expressed by the following Equation;

$$fosc = fCLK \times \Delta S/2^M \quad (1)$$

Since the sum data ΔS is an integer, if M is within ±100 Hz of the frequency of the color subcarrier fsc of the four television standards, M will be 15 when the master clock fCLK is 16 MHz. The fosc precision will not be changed even if the bit length is lengthened about 2 or 3 bits.

This is because an integral error which arises when the sum data ΔS sought is contained. Accordingly, if the bit length is 15, it will be possible to decrease the bit length by about 7 or 9 bits from the conventional device without sacrificing precision, a reduction of about two-thirds the number of bits from the conventional device. Of course, the latch steps are also decreased in proportion to the bit length.

Figure 12:
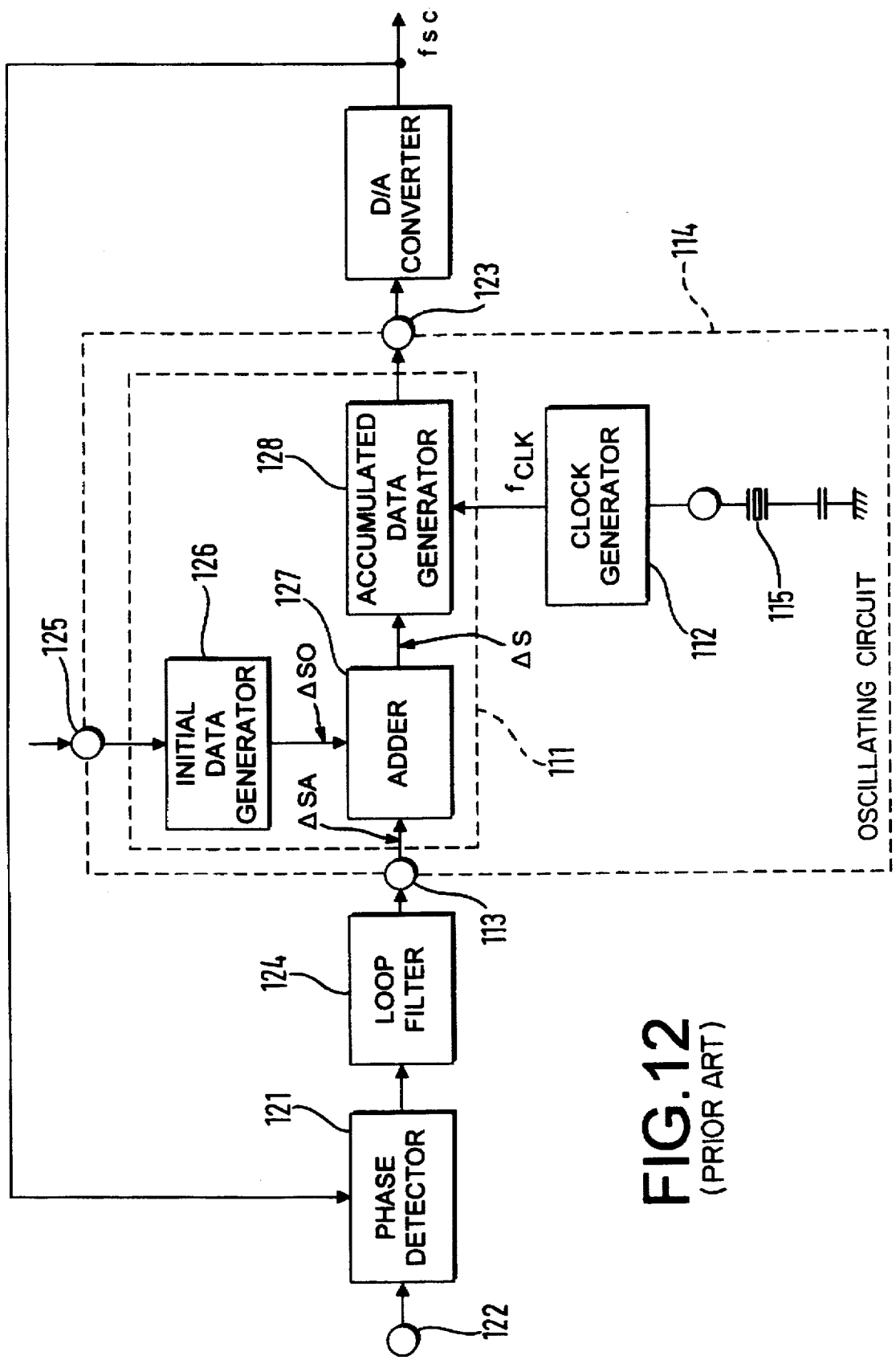
FIG. 12 is a block diagram for explaining a digital APC circuit using FIG. 11.

The initial data ΔSO in the conventional system, as shown in FIG. 12, will be M=22 and sum data ΔS=1162247 when it is calculated from equation (1) in the case of a BG-PAL system. The initial data needs almost the same bit length as the accumulating addition of the accumulated data generator 128. However, in this embodiment, the adder is not necessary so, it can get almost the half of the scale reducing effect as a whole system of the digital oscillation circuit 11.

Figure 11:
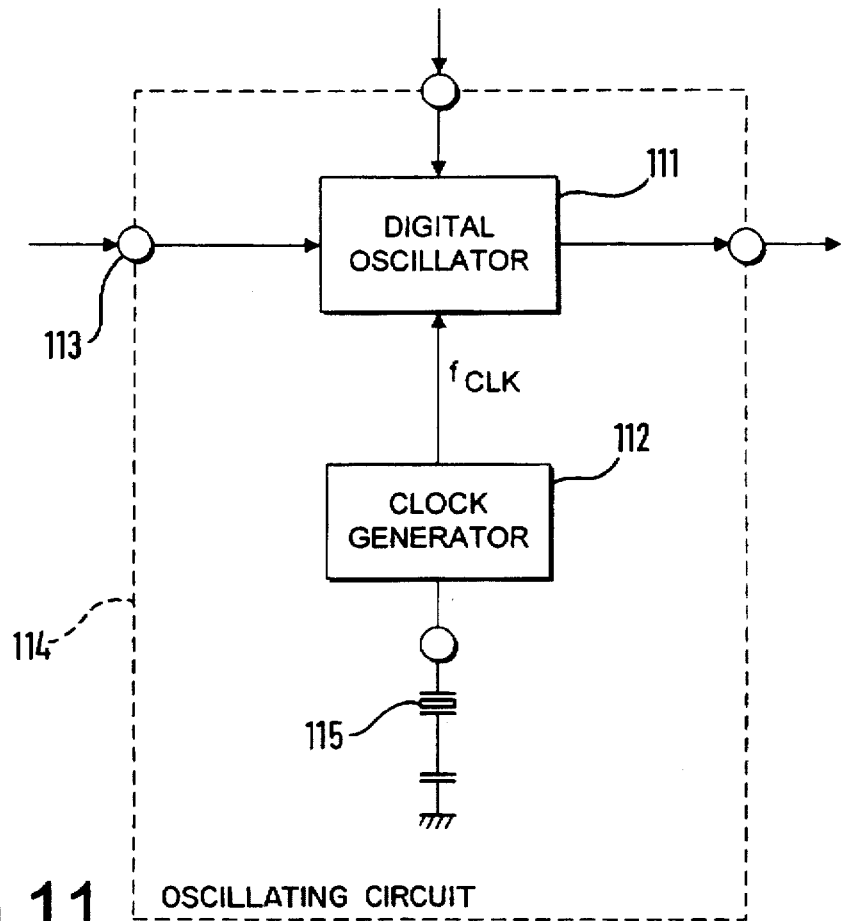
FIG. 11 is a block diagram showing a conventional digital oscillator.

Since the output of the analog phase detector 21 does not have a element of the clock delay, the output can be obtained in real-time. Further, since the analog phase detector 21 does not have the clock delay factor, which was needed for synchronizing the timing of the comparison result data ΔSA and the initial data ΔSO in the adder 127 in the conventional FIG. 12, the same pull-in time as the APC in FIG. 10 can be obtained. Accordingly the operation which took eight fields in FIG. 11 can be done with four fields in this embodiment, greatly reducing the visual delays caused by long cycles.

Figure 13:
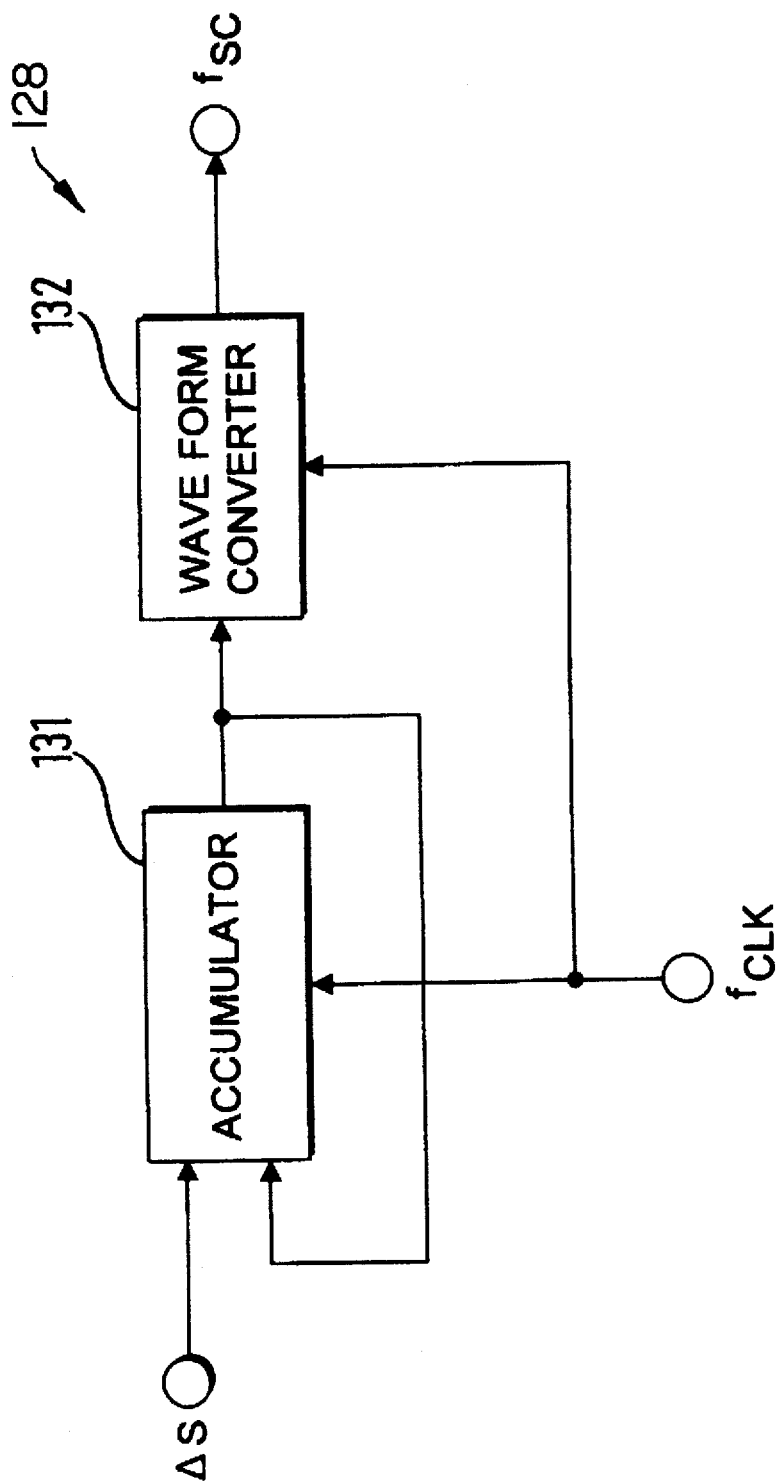
FIG. 13 is a block diagram for explaining an accumulated data generator in FIG. 12.
Figure 14:
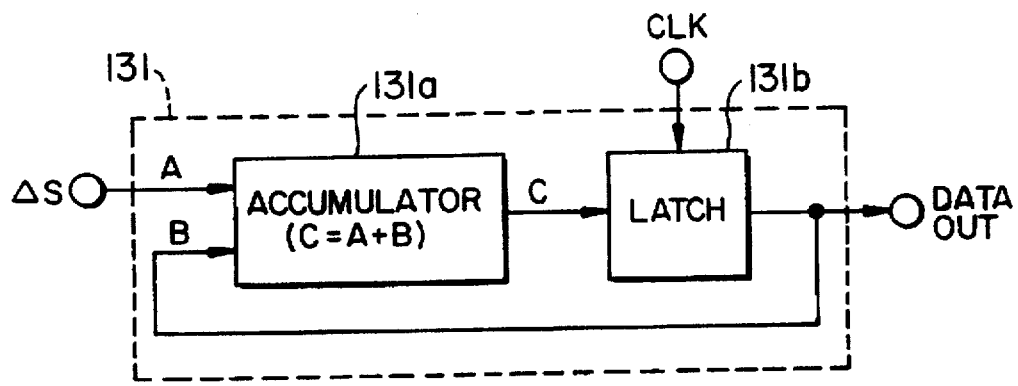
FIG. 14 is a block diagram showing the components of a conventional accumulated data generator.

Here, the construction of the accumulated data generator 15a in FIG. 2 is the same as an accumulated data generator 128 in FIG. 12 and the construction example is the same as FIG. 13. A detailed explanation of the accumulated data generator 15a will be omitted here, but since the bit length in the circuit is different, it can not be regarded in the same light as the construction example in FIG. 13.

Figure 3:
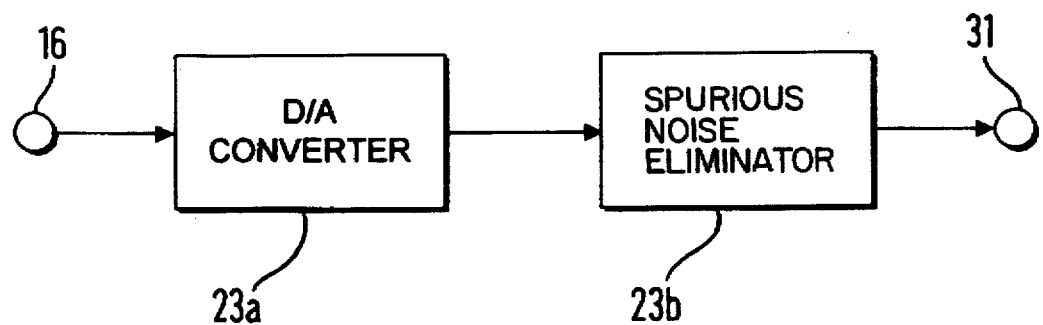
FIG. 3 is a block diagram for explaining an example of the analog converter in FIG. 2.

Next, the embodiment of the analog converter 23 in FIG. 2 is explained by using FIG. 3. The analog converter 23 ia a circuit which inputs the data sequence from the accumulated data generator 15a and converts the data into an analog signal. The data sequence from the accumulated data generator 15a is sent to the input terminal 16. The input data sequence is converted into an analog signal by a D/A converter 23a. However, since the output signal is still involved in sampling, the output signal is just converted into a voltage signal. Accordingly; it leaves a lot of spurious components containing an alias which must be removed. The spurious components are removed in a spurious noise rejection circuit 23b. An analog color subcarrier fsc is output to an output terminal 31 from the spurious noise rejection circuit 23b. The conventional circuit shown in FIG. 13 does not have the analog converter 23, but the analog output is necessary to connect an oscillator 114 in FIG. 11 into the analog system as a matter of course, and thus the analog converter is necessary as well in the conventional circuit.

FIG. 4 shows another system of the APC circuit according to the present invention which incorporates a digital phase detector without using the analog phase detector. A burst signal of the digital data, which is converted in the A/D converter (not shown), is sent through an input terminal 41 to one input of a digital phase detector 42. A digital output from the output terminal 16 of a digital oscillating circuit 11 is applied to the other input of the digital phase detector 42 for phase detection. The detected output data is supplied to an analog converter 44 via a loop filter 43. The analog conversion signal is supplied to a frequency control input terminal 14 of the oscillating circuit 11 to control the oscillation frequency of the clock generator 12. According to the above configuration, the clock is controlled by analog operations. Thus, it is possible to reduce the bit length of the oscillating circuit 11 and thus decrease the cost of the oscillating circuit 11.

However, in the case of FIG. 4, since the phase-detection output represents a digital signal, the frequency jump corresponding to one bit of data as explained in reference to FIG. 12 occurs. The degree of the frequency jump depends on the bit size of the analog conversion or phase-detection output. But, those matters can be improved by changing the positional order of the loop filter 43 and the analog conversion circuit 44 through configuring the loop filter 43 in analog operations or properly adjusting the characteristics of the loop filter 43. Since delays, such as those caused in the adder 127 in the conventional system shown in FIG. 12, do not occur in the system shown in FIG. 4, the APC pull-in time is improved compared to that in the conventional system of FIG. 12.

Thus, the APC circuits according to the present invention do not lower the essential effect of the circuits even though there is a slight difference in the digital or analog configuration of the phase detector.

Referring now to FIG. 5, still another system of the APC circuit according to the present invention will be explained. The system shown in FIG. 5 is a modification in which a phase controller 51 is added for processing the control signal to the analog phase detector 21 shown in FIG. 2. In some applications, it is desirable to make the phase of the signal supplied to the phase detector different from the phase of the signal used in other circuits. In this case, the phase controller 51 receives the analog conversion signal output from the analog converter 23. An output of the phase controller 51 is fed back to the phase detector 21. The phase controller 51 consequently outputs another phase-controlled signal as the color subcarrier signal fsc. Here, when a phase controller, such as the phase controller 51, is used in the system shown in FIG. 4, the phase controller can be inserted between the output terminal 16 of the oscillating circuit 11 and the phase detector 42.

Figure 6:
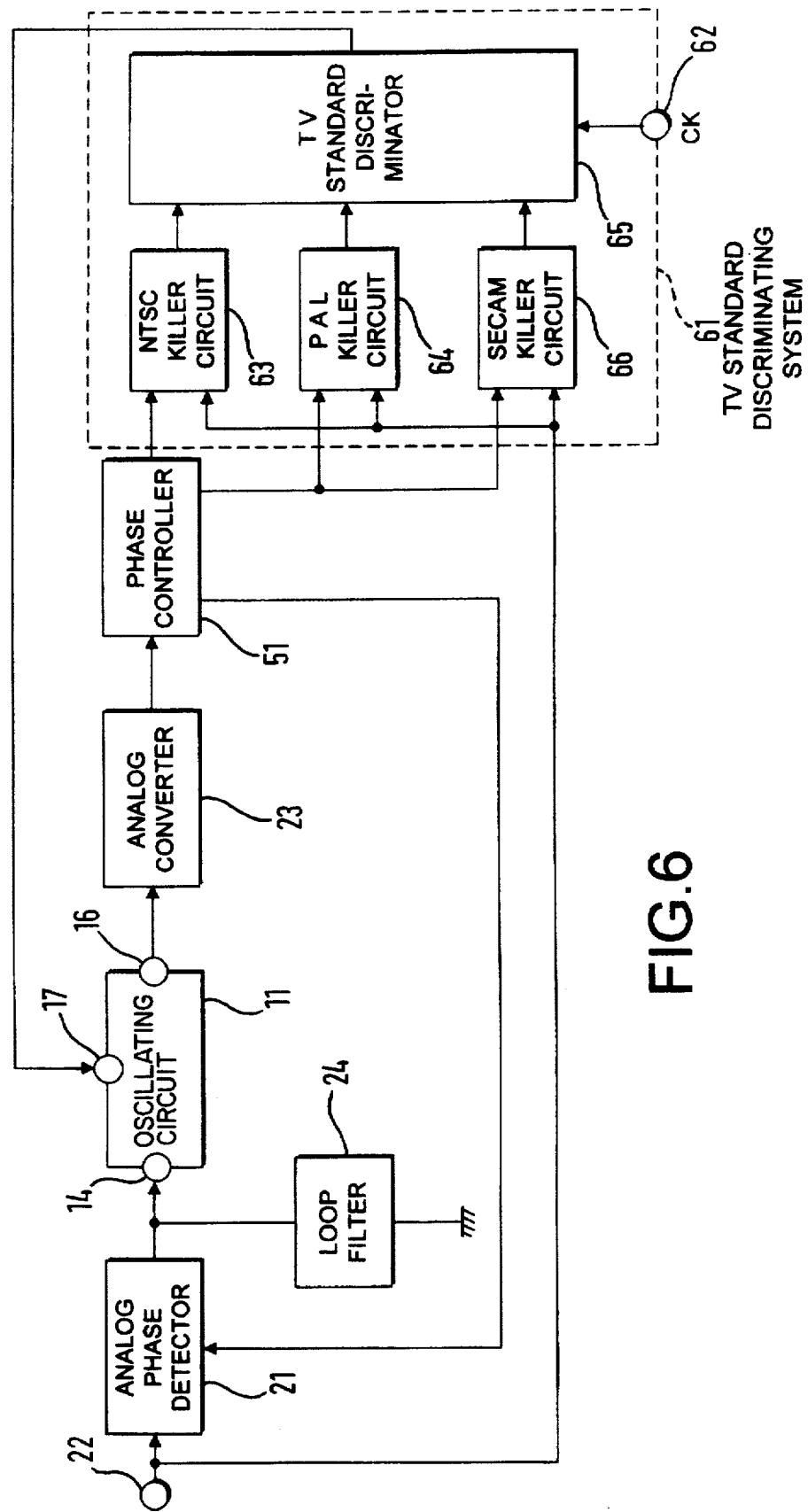
FIG. 6 is a block diagram for explaining another example which combines the system of the television standard discrimination with the system shown in FIG. 5.

Referring now to FIG. 6, the system shown in FIG. 5 in cooperation with the television standard discriminating system will be described. Further, the function of the fsc changing terminal 17 in television receivers will be also explained. Accordingly, in FIG. 6 the analog phase detector is illustrated based the circuit configuration of analog phase detectors.

In FIG. 6, the output of the oscillator 11 is converted into analog signals in the analog converter 23 and then input to the phase controller 51. One output of the phase controller 51 is fed back to the analog phase detector 21. A television standard discrimination system 61 is provided for receiving the output signal from the phase controller 51, the input burst signal on the input terminal 22, and a clock signal CK through a clock input terminal 62. The output of the discrimination system 61, i.e., an fsc changing signal, is fed back to the control terminal 17 of the oscillator 11. The television standard discrimination system 61 is provided with an NTSC killer circuit 63 and a PAL killer circuit 64 which both receive the burst signal. The phase detector 51 provides the NTSC killer circuit 63 and the PAL killer circuit 64 with respective suitably phase-controlled color subcarrier signals fsc. The outputs of the killer circuits 63 and 64 are supplied to a television standard discrimination circuit 65 for discriminating the standard of the presently received signal.

The NTSC killer circuit 63 discriminates whether the presently received signal is an NTSC signal or not by processing the phase-controlled color subcarrier fsc and the burst signal. The PAL killer circuit 64 discriminates in the same manner as the NTSC killer circuit 63. However, since the burst signal at the PAL system has different phases at each line, the PAL killer circuit 64 provides color subcarrier signals fsc which are suitably phase-controlled in synchronism with the phase change of the burst signal. Since the phase control as mentioned above is needed for the processing of the color subcarrier signal fsc of the TV receiver, the phase controller is located between the oscillating circuit 11 and the phase detector 21. Such a phase control is also needed for the color subcarrier signal fsc supplied to demodulators. The clock signal CK input to the television standard discrimination circuit 65 is a four field cycle clock signal. Thus, the television standard discrimination circuit 65 generates the fsc changing signal based on the unit of the four field cycle. For instance, when a signal is neither associated with the NTSC system nor the PAL system, the frequency of the color subcarrier signal fsc is changed every four fields. In the initial data generator 15b, the value of the sum data ΔS is changed based on the changes of the color subcarrier signal fsc every four fields. Thus, the television standard of the presently received chrominance signal is discriminated.

Here, if the PAL standard signal is received, the PAL killer circuit 64 outputs a signal corresponding to the PAL standard signal. The television standard discrimination circuit 65 discriminates the output signal of the PAL killer circuit 64 as a PAL system signal when referring the output of the NTSC killer circuit 63 or the color subcarrier signal fsc. At the time, the fsc changing signal is deactivated and the current frequency of the color subcarrier signal fsc is maintained. Further, a PAL demodulating circuit (not shown) is activated for reproducing a PAL demodulating color difference signal. Similar operations are also carried out when receiving the NTSC standard signal.

Since the SECAM standard system processes signals in a different manner from the PAL and the NTSC standard systems, the operation for receiving a SECAM standard signal is basically not related to the oscillation of the color subcarrier signal fsc. However, if the fsc oscillating circuit 11 changes the oscillation frequency at the SECAM receiving time, the chrominance signal displayed on a screen is affected by a leakage signal of the color subcarrier fsc. So, during the SECAM receiving time, the color subcarrier signal fsc is usually fixed with that of the PAL or the NTSC system. Thus, monitoring of killer information of the SECAM system at the television standard discrimination circuit 65 is usually required. When the receiver is fully adapted to receive the SECAM system, the killer information of the SECAM killer circuit 66 is input to the television standard discrimination circuit 65 and the comprehensive television standard discrimination is carried out. Even if such a full multi standards-ready color television receiver is adapted for all standards including the SECAM standard, the presently received standards is sure to be automatically discriminated by cyclically performing the change of the color subcarrier signal fsc.

In the case of a television receiver for use in South America, the sum data ΔS can be prepared for the NTSC system and the M-PAL and N-PAL systems, and in case of a television receiver for use in Europe, Asia, or other countries, the PAL and NTSC systems can be changed.

On the other hand, in the case of the PAL system, its color subcarrier is interleaved between horizontal frequencies by means of so-called ¼ line offset techniques. Since the burst signal is phase-controlled to 90 degrees every line, apparent frequencies are not unified. Since sideband components caused by the operation are combined on a frequency axis, if the pull-in frequency range of the color subcarrier signal fsc at the receiving side is wide, the sideband components cause a fault-locking malfunction to the sideband components. So, to oscillate the color subcarrier signal fsc, a device such as a quartz oscillator having a stable reference frequency, a high degree of Q, and an order of around $10^6$ (i.e. PPM) in errors of the frequency variable limits and the initial oscillation frequency could be used.

In the case of the conventional quartz oscillator circuit 103 in FIG. 10, the damping resistance on the terminal provided for connecting the quartz oscillators to the PAL system is lowered to decrease the Q of the circuit, and the frequency band is made wide enough so that the variable limits will not expand to the frequencies causing the fault-locking. Hereinafter, some measures applied in the present invention will be described in detail.

In the digital oscillating circuit of the present invention, the oscillation frequency of the clock generator 12 is fixed, i.e., the oscillation frequency is unchanged even if it generates any frequency needed for the color subcarrier signals fsc of the above-mentioned four standards. However, since the ΔS of an initial data generator 15b is controlled by a television standard discriminator 65, the oscillated frequency can be discriminated between that used in the PAL standard and the other standards. Accordingly, the frequency band of the oscillating circuit 11 in the case of the PAL standard is narrower than that of the other standards so that it is able to carry out an adaptive control. Generally, the frequency band of the oscillating circuit 11 is defined by not only a damping resistance but also a vector composition ratio.

By making the vector composition ratio small, the frequency variable limits can be controlled from outside. So, when the signal is oscillated with a PAL frequency, the vector composition ratio may be controlled or changed to become small. Of course, when the signal is oscillated with a PAL frequency, specific variable limits are set up, and when it is oscillated with the other color subcarrier signals fsc, the variable limits can be widened.

The embodiment mentioned above explains a case where the system in FIG. 1 is input to the PLL loop. The case of a system that is not input to the PLL loop will explained hereinafter.

In some applications, the oscillation frequency of the oscillator can be changed in a step-wise manner so that frequency-locking is not required. For instance, there is an application using SIF (sound intermediate frequency) handling in the multi-standards-ready color television receiver. There are four television standards for SIF handling in television signals. In Japan, 4.5 Mhz is used for the SIF, while other countries also use 5.5 MHz, 6.0 MHz and 6.5 MHz for the SIF. When these SIF signals are received in one television receiver, they are frequency-converted to a single IF so that the signal can be processed by only one audio signal detection circuit. There are many ways to set up the in the frequency arrangement. For instance, if the second IF next to the first frequency conversion is set to 500 KHz, the television receiver is required to accommodate four local oscillation frequencies of 4.0 MHz, 5.0 MHz, 5.5 MHz and 6.0 MHZ for conversion of the 4.5 MHz SIF, the 5.5 MHz SIF, the 6.0 MHz SIF and the 6.5 MHz SIF. The present invention is suitable for application in such an SIF local oscillator. For the second IF, it will be sufficient to have a tracking efficiency of 0.1% for converting the frequency of the received signal to about 500 KHz. Generally, a reference oscillator is provided for this usage. Some of integer-times frequencies are then produced from the reference frequency by using a frequency synthesizer, and the produced frequencies are used as respective local oscillation signals. In this case, many frequency dividers and a loop filter are required since the frequency synthesizer is itself arranged in a PLL configuration.

Figure 7:
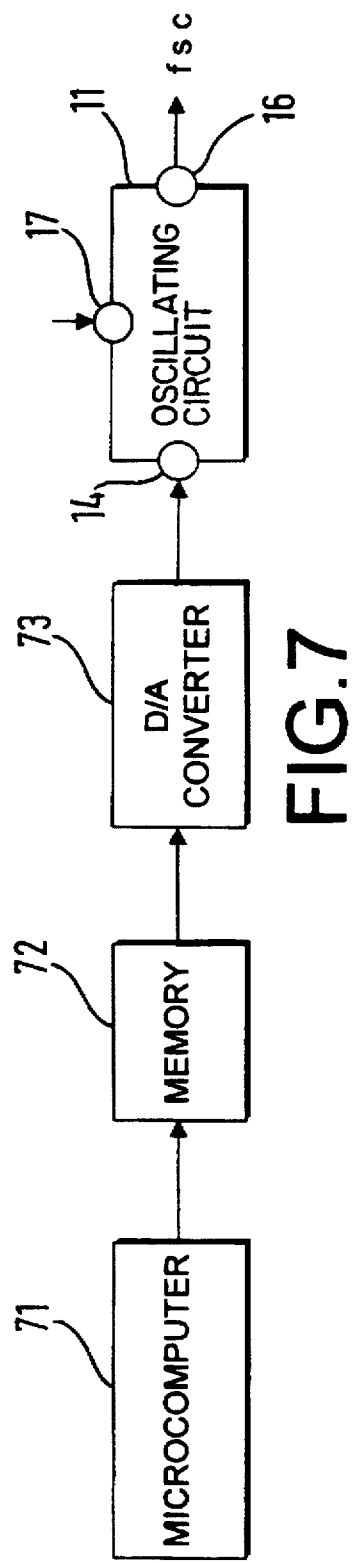
FIG. 7 is a block diagram for explaining a slight adjustment of the oscillation frequency of the present invention.
Figure 8:
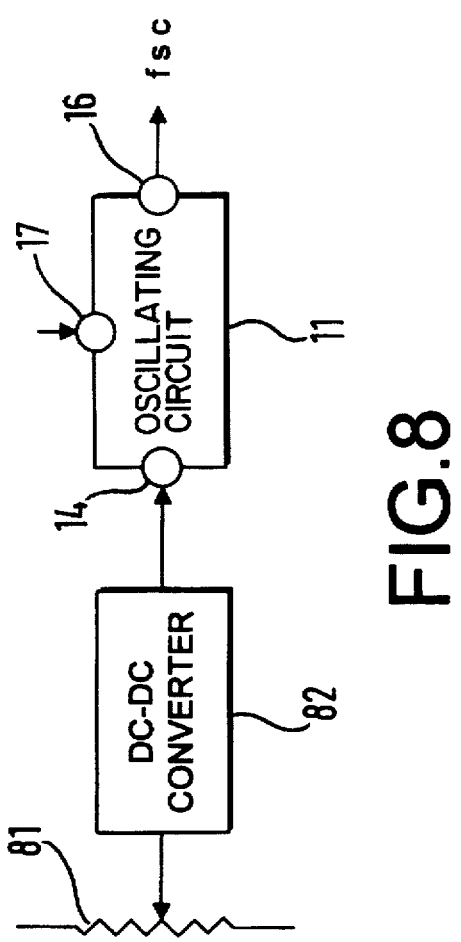
FIG. 8 is a block diagram for explaining another slight adjustment of the oscillation frequency of the present invention.

On the other hand, the oscillator according to the present invention can generate arbitrary frequencies from the reference signal and without requiring such a loop filter. In the conventional system, the PLL technique is used for overcoming the unstableness of the oscillation frequency due to the dispersion of time constants obtained in the IC configuration. By contrast, the present invention can provide good precision of the reference frequency without using the PLL technique. Further, since a spectrum of the signal obtained from the digital oscillating circuit 11 has the same precision as the clock generator 12 for the reference signal, it provides an extremely pure color presentation with less spurious noise. Although the present invention does not require the APC (PLL) loop, the initial oscillation error in the clock generator 12 or the initial oscillation data error caused by controlling the bit length of the accumulated data generator 15a may cause a slight aberration in the tracking frequency. Referring now to FIGS. 7 and 8, a method for compensating for the aberration will be described. The choice of the receptions, which will determine the frequency among the above-mentioned four television standard SIFs, is selected by a microcomputer. So, if proper compensations corresponding to these four television standards are conducted it is possible to cancel the initial oscillation error.

In FIG. 7, compensation data are provided from a microcomputer 71 to a memory 72. An output of the memory 72 is supplied to a D/A converter 73. An analog output from the D/A converter 73 is supplied to a frequency control terminal 14 of the oscillator 11. In this case, the clock frequency is controlled by an analog voltage or a current signal converted from the compensation data from the microcomputer 71. The memory 72 can be of either a RAM or a ROM. The compensation data can be prepared by adjusting the data once and then applying it to the microcomputer every time it is needed, or the compensation data can be stored in a ROM in advance and then selectively read from the ROM in response to a changing signal of the four standard SIFs. Further, when the SIF frequency is changed using the changing terminal 17 with a sufficient precision, control data from the microcomputer 71 can be used for adjusting the master clock fCLK. Thus, it can output different frequencies with high precision and high purity. In manufacturing lines, since the data is managed by microcomputers the adjustment process does not need any skill to execute, making it simple to use.

When the master clock FCLK or the aberration cannot be adjusted with the aid of microcomputers, the adjustment can be done manually as shown in FIG. 8. In this case, the aberration to each frequency or the master clock fCLK is adjusted by using a variable resistor 81. The adjusted data are then applied from the variable resistor 81 to the frequency terminal 14 of the oscillator 11 through a DC—DC converter 82. Here, when the clock generator 12 can be directly controlled, the DC—DC converter 82 can be omitted. In this case, there is also an advantage that the adjusting range is arbitrarily set up and that a capacitive element involved in the oscillation is not directly operated.

Further, the quartz oscillator is employed as the resonant element in the clock generator 12 for use in television receivers. However, any other element may be used as long as it has good frequency selectivity. One example of such an element is shown in FIG. 9. A parallel LC resonant circuit 91 is used in the example of FIG. 9. Of course, it can be a series resonant circuit. It may well be that a certain resonant element is used in the clock generator 15 and its oscillation frequency is changed by the internal circuit according to the control signal provided through the control terminal 14.

Figure 15:
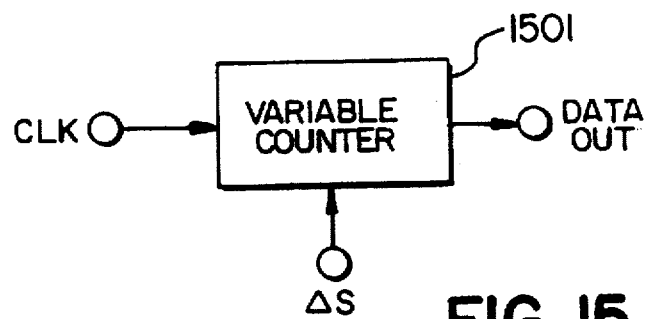
FIG. 15 shows a variable counter used in another embodiment of the present invention.
Figure 16:
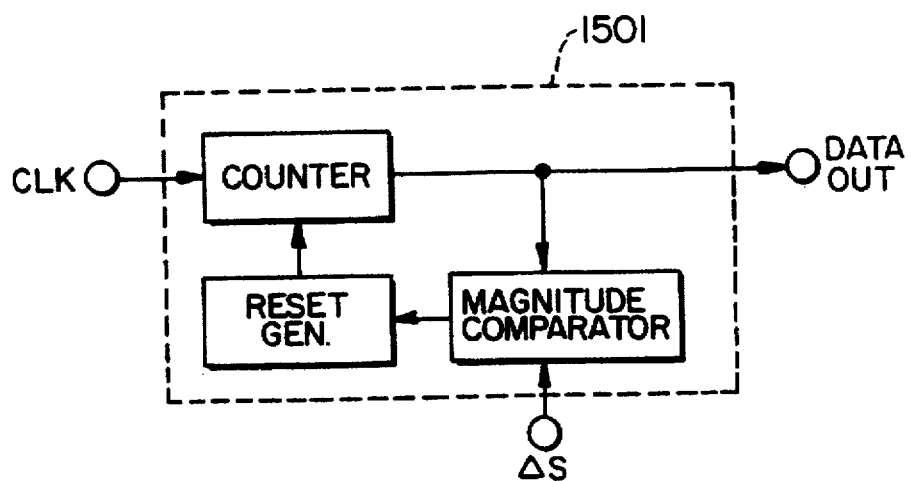
FIG. 16 shows the components of the counter of FIG. 15.

In the above descriptions, since the present invention is explained in reference to television receivers, the accumulated data generator 15a is employed for these illustrative examples. However, the accumulated data generator is not always necessary in other applications. Although it is normal for the color subcarrier signal fsc of the television signal to differ between different television standards, the frequency of the color subcarrier signal fsc is inherently off-set to avoid having an integer ratio correlating with a horizontal frequency. Thus, there is normally no correlating integer ratio among the color subcarrier signals fsc of the different television standards. However, there may be a case of having such a correlation occurs. In such a case, the accumulated data generator can be replaced with a counter 1501 such as the one shown in FIGS. 15 and 16. As mentioned in the document, "Digital Television Standard Waveform Generator", pp. 295–304, the master clock fCLK can be counted for reading out the waveform data as addresses so that the same effect will be obtained. That is, if the data sequence changing in the sawtooth-waveform state is in either the digital oscillator or the counter, the same result as mentioned above will be obtained for both cases.

There are two ways to use such counters. One way is to change the frequency dividing ratio for changing the maximum value, i.e., the amplitude of the generated data sequence. In this case, since the frequency dividing ratio can be arbitrarily changed, a very low frequency can be set up. The other way is to fix the count cycle of the data sequence but change the bit to be read-out. In this case, the counter is a $2^L$ (L is an integer) binary counter which fixes the generating cycle of the data sequence. When the counter output is read out starting from the MSB, the data sequence at the lowest frequency is obtained, while twice the frequency is obtained when the data sequence is read out starting from the next bit of the MSB.

Accordingly, the above construction is limited to generating a frequency which will change at a ratio of $2^K$ (K is a whole number). When generating a frequency sequence having a ratio very close but slightly different from the $2^K$ ratio, it may be enough to widen the frequency variable limits of the clock generator corresponding to the errors to obtain the same effect without using accumulators.

Further, the present invention can be used to generate many frequencies from one master clock with high precision. Such a circuit will need a circuit for determining which frequency among the many frequencies is used for an end oscillation frequency. In television receivers, killer circuits are used for the determination, while in general, circuits for detecting a phase detecting state are used for the determination. Furthermore, the determining element differs according to the type of function required for devices using the present invention. Here, the term "determining element" will be defined to include circuits for detecting the phase detecting state.

According to the present invention, a digital oscillating circuit having reduced circuit scale and low cost can be realized. Also, by using an oscillator for the APC (PLL) circuit, the APC pull-in time can be shortened.

As described above, the present invention can provide an extremely preferable oscillating circuit.

While there have been illustrated and described what are at present considered to be preferred embodiments of the present invention, it will he understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

The foregoing description and the drawings are regarded by the applicant as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer or alternative inventive concepts that are included in the contents of the application and could be defined by claims differing in scope from the following claims, which different claims may be adopted subsequently during prosecution, for example, for the purposes of a divisional application.

I claim:

1. A digital oscillating circuit, comprising:

a frequency-controllable clock generator;

a digital oscillator connected to the clock generator, the digital oscillator generating a data sequence waveform having an oscillation frequency related to the frequency of a clock signal generated by the clock generator such that the oscillation frequency is controllable by the clock signal; and means for converting the data sequence waveform of the digital oscillator into an oscillator output signal for identifying a television standard, the oscillator output signal being used as a frequency control signal to control the frequency of the clock signal from the clock generator.

2. The digital oscillating circuit as claimed in claim 1, wherein the digital oscillator has a waveform converter for changing the data sequence waveform into an arbitrary output waveform.

3. The digital oscillating circuit as claimed in claim 1, wherein the clock generator has input terminals for connecting the clock generator with a resonant element and for receiving the frequency control signal.

4. The digital oscillating circuit as claimed in claim 1, wherein the digital oscillator comprises an initial data generator which generates initial data and an accumulated data generator which accumulates the initial data and generates the data sequence waveform.

5. The digital oscillating circuit as claimed in claim 4, wherein the accumulated data generator comprises an accumulator and a latch.

6. The digital oscillating circuit as claimed in claim 4, wherein the accumulated data generator comprises a counter.

7. The digital oscillating circuit as claimed in claim 1, wherein the clock signal frequency is controlled by a DC voltage or DC current.

8. The digital oscillator of claim 1, wherein said converting means includes a digital-to-analog converter for converting an output from the digital oscillator into an analog signal and an analog phase detector for receiving the output from the digital-to-analog converter and outputting the frequency control signal.

9. A digital oscillating circuit system, comprising:

an frequency-controllable clock generator;

a digital oscillator connected to the clock generator, the digital oscillator generating a data sequence waveform having an oscillation frequency related to the frequency of a clock signal generated by the clock generator such that the oscillation frequency is controllable by the clock signal;

a converter connected to the output of the digital oscillator for converting an oscillator output signal based on the data sequence waveform from the digital oscillator into an analog signal for identifying a television standard and outputting the analog signal from the converter;

an analog phase detector for comparing a phase of the analog signal output from the converter with an input signal and outputting a phase difference signal; and a loop filter connected to the analog phase detector for filtering the phase difference signal and outputting the filtered output signal to the clock generator to control the frequency of the clock generator.

10. The digital oscillating circuit system as claimed in claim 9, wherein the converter comprises a D/A converter and a spurious noise rejection circuit.

11. The digital oscillating circuit system as claimed in claim 10, wherein the output of the converter is connected to the analog phase detector via a phase controller.

12. A digital oscillating circuit, comprising:

an frequency-controllable clock generator;

a digital oscillator connected to the clock generator, the digital oscillator generating a data sequence waveform having an oscillation frequency related to the frequency of a clock signal generated by the clock generator such that the oscillation frequency is controllable by the clock signal;

a digital phase detector for comparing the phases of an oscillator output signal based on the data sequence waveform and an input signal and outputting a phase difference signal;

a digital filter connected to the digital phase detector for filtering the the phase difference signal and outputting the filtered output; and a D/A converter connected to the digital filter for converting the filtered output into an analog signal identifying a television standard and outputting the analog signal to the clock generator to control the clock frequency of the clock generator.

13. The digital oscillating circuit as claimed in claim 12, wherein the oscillator output signal of the digital oscillator is input to the digital phase detector via a phase controller.

14. A digital oscillating circuit system, comprising:

a frequency-controllable clock generator;

a digital oscillator connected to the clock generator, the digital oscillator generating a data sequence waveform having an oscillation frequency related to the frequency of a clock signal generated by the clock generator such that the oscillation frequency is controllable by the clock signal, wherein a frequency band of the clock generator is variable as a function of a frequency switching state of an accumulated data generator in the digital oscillator for identifying a particular television standard;

a converter connected to the output of the digital oscillator for converting an oscillator output signal based on the data sequence waveform from the digital oscillator into an analog signal for identifying the television standard and outputting the analog signal from the converter;

an analog phase detector for comparing a phase of the analog signal output from the converter with an input signal and outputting a phase difference signal; and a loop filter connected to the analog phase detector for filtering the phase difference signal and outputting a filtered output signal to the clock generator to control the frequency of the clock generator.

15. A digital oscillating circuit system, comprising:

a frequency controllable clock generator;

a digital oscillator connected to the clock generator, the digital oscillator generating a data sequence waveform having an oscillation frequency related to the frequency of a clock signal generated by the clock generator such that the oscillation frequency is controllable by the clock signal;

a converter connected to the output of the digital oscillator for converting an oscillator output signal based on the data sequence waveform from the digital oscillator into an analog signal for identifying the television standard and outputting the analog signal from the converter;

an analog phase detector for comparing a phase of the analog signal output from the converter with an input signal and outputting a phase difference signal; and a loop filter connected to the analog phase detector for filtering the phase difference signal and outputting a filtered output signal to the clock generator to control the frequency of the clock generator; and a discriminating means for identifying a synchronizing state of the input signal and the oscillator output signal, wherein the discriminating means changes a frequency band of the clock generator based on the output of the discriminating means.

16. The digital oscillating system circuit as claimed in claim 15, wherein the input signal is a television signal and the discriminating means is a circuit for identifying a type of television system.

17. The digital oscillating circuit system as claimed in claim 16, wherein the discriminating means discriminates among a plurality of television systems by repeatedly changing the frequency band of the clock generator over a period of time and terminating the changing of the frequency band of the clock generator when a reception of a predetermined television system has been identified.

18. The digital oscillating circuit system as claimed in claim 17, wherein a phase controlled signal required for television system identification is output from a phase controller to the discriminating means.

19. A digital oscillating circuit, comprising:

a frequency-controllable clock generator;

a digital oscillator connected to the clock generator, the digital oscillator generating a data sequence waveform having an oscillation frequency related to the frequency of a clock signal generated by the clock generator such that the oscillation frequency is controllable by the clock signal and outputting an oscillator output signal based on the data sequence waveform for identifying a television standard;

a memory circuit for storing an external digital data and generating a memory circuit output based on the external digital data; and means for analog converting the memory circuit output into a signal for controlling the clock frequency.

* * * * *